United States Patent [19]
Decuir

[11] Patent Number: 5,781,028
[45] Date of Patent: Jul. 14, 1998

[54] SYSTEM AND METHOD FOR A SWITCHED DATA BUS TERMINATION

[75] Inventor: Joseph C. Decuir, Bellevue, Wash.

[73] Assignee: Microsoft Corporation, Redmond, Wash.

[21] Appl. No.: 668,287

[22] Filed: Jun. 21, 1996

[51] Int. Cl.[6] .................................................. H03K 17/16
[52] U.S. Cl. .............................. 326/30; 326/21; 326/86
[58] Field of Search ............................. 326/21, 27, 30, 326/82, 87, 86

[56] References Cited

U.S. PATENT DOCUMENTS

| | | | |
|---|---|---|---|
| 5,457,406 | 10/1995 | Takada et al. | 326/30 |
| 5,528,168 | 6/1996 | Kleveland | 326/30 |
| 5,578,939 | 11/1996 | Beers et al. | 326/82 X |
| 5,604,450 | 2/1997 | Borkar et al. | 326/30 X |
| 5,635,852 | 6/1997 | Wallace | 326/30 |

OTHER PUBLICATIONS

Microprocessor and Microcomputer Standards Commitee of the IEEE Computer Society (Sponsor), *IEEE Standard for a High Performance Serial Bus*, The Institute of Electrical and Electronics Engineers, Inc., New York 1996.

*Serial Bus Specification Revision 0.8*; Compaq Computer Corporation, Digital Equipment Corporation, Intel Corporation, Microsoft Corpporation, NEC Corporation, and Northern Telecom; Dec. 30, 1994.

*Primary Examiner*—Jon Santamauro
*Attorney, Agent, or Firm*—Seed and Berry LLP

[57] ABSTRACT

A bidirectional universal serial bus (USB) includes switched terminations that are selectively activated to terminate the receiving end of the data bus in its characteristic impedance. The USB includes a twisted pair data cable that permits bidirectional data communication between a USB interface in a computer and a USB peripheral device. To control the bidirectional communication, the USB defines a transmit mode and a receive mode. Each end of the twisted pair data cable includes a selectively activatable switch termination that terminates the twisted pair data cable in its characteristic impedance when selectively activated. When the USB peripheral device is in the receive mode, the switched termination within the USB peripheral device is selectively activated so that the twisted pair data cable is terminated in its characteristic impedance. This reduces ringing and electromagnetic (EM) radiation on the twisted pair data cable. The switched termination within the USB interface in the computer is not activated when the USB interface is in the transmit mode. If the USB peripheral is placed in the transmit mode, and the USB interface in the computer is placed in the receive mode, the switched termination within the USB interface in the computer is selectively activated while the switched termination within the USB peripheral is placed in an inactive state. In this manner, the twisted pair data cable is always terminated in the proper impedance only at the receiving end.

44 Claims, 7 Drawing Sheets

5,781,028

SYSTEM AND METHOD FOR A SWITCHED DATA BUS TERMINATION

TECHNICAL FIELD

The present invention relates to a method and apparatus for bus termination, and more particularly, to a method and apparatus for switching data bus terminations.

BACKGROUND OF THE INVENTION

Computers are used in many applications. Communication between computers or between computers and peripherals often requires high-speed data communication links. These data communication links may be thought of as transmission lines. Proper termination of a data transmission line is essential to prevent "ringing" on the transmission line, and to reduce electromagnetic (EM) radiation caused by the ringing. In some transmission lines, fixed terminations are provided at each end of the transmission line to reduce ringing and EM radiation. If the transmission line is bidirectional, a transmitting device must be capable of driving both the fixed termination and the transmission line itself. However, this approach is unacceptable if the transmitting device is low power because a significant amount of the available power is consumed by the transmitting device to drive the fixed terminations at each end of the transmission line. Therefore, it can be appreciated that there is a significant need for a data bus termination capable of operation with a low power transmitting device. The present invention provides this and other advantages as will be illustrated by the following description and accompanying figures.

SUMMARY OF THE INVENTION

The present invention is embodied in a system and method for the switched termination of a bidirectional data bus. The bidirectional data bus has first and second ends, and the system has transmitting and receiving modes. The system comprises a first termination coupled to the bidirectional data bus first end and selectively activated when the system is in the receiving mode to terminate the bidirectional data bus first end. The system further includes a second termination coupled to the bidirectional data bus second end and selectively activated when the system is in the transmitting mode to terminate the bidirectional data bus second end. In this manner, the first termination is inactive and the second termination is active when the system is in the transmitting mode, and the first termination is active and second termination inactive when the system is in the receiving mode.

In one embodiment the bidirectional data bus is a data cable having first and second wires. The first and second terminations are impedance elements coupled between the first and second wires at the first and second ends of the bidirectional data cable, respectively. The impedance elements are typically semiconductor switch elements such as CMOS transistors coupled between the first and second wires at the first and second ends of the bidirectional data cable. The switch elements have a first impedance when selectively activated and a second higher impedance when not selectively activated.

Alternatively, the first termination may be coupled between the first wire and a first reference signal, and the second termination coupled between the second wire and a second reference signal. In yet another alternative, the terminations may be coupled to a single termination reference with switches being activated to selectively activate the first and second terminations. The switches are typically transistors, such as field effect transistors, or CMOS transistors.

The system may further include first and second capacitive elements in conjunction with the first and second terminations to provide alternating current (AC) pathways for the first and second terminations. This advantageously provides an AC termination, while eliminating a direct current (DC) pathway, thus reducing DC current demand in the system.

DETAILED DESCRIPTION OF THE INVENTION

Figure 1:
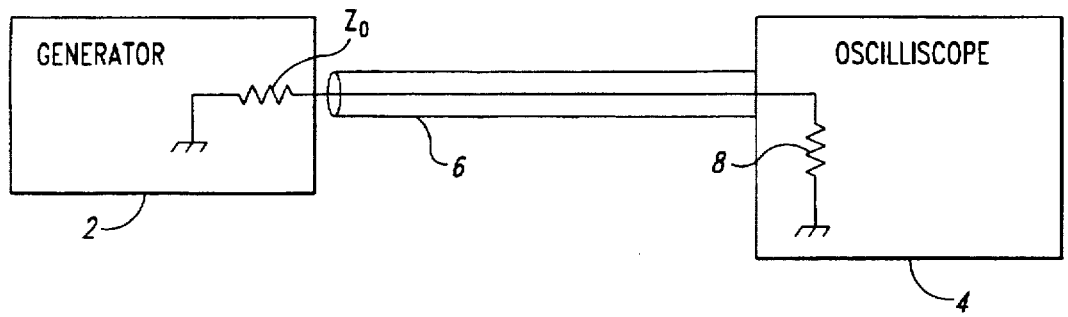
FIG. 1 is a functional block diagram illustrating a conventional unidirectional transmission line and termination.

As discussed above, the use of a termination on a transmission line is well known. For example, FIG. 1 illustrates the conventional connection of a generator 2 to another device such as an oscilloscope 4 using a transmission line 6. The transmission line 6 may typically be a coaxial cable. The generator 2 has a characteristic output impedance, designated as $Z_0$ in FIG. 1. The output impedance $Z_0$ is designed to match the characteristic impedance of the transmission line 6. For example, the output impedance $Z_0$ of the generator 2 is typically 50 ohms in order to match the characteristic impedance of coaxial cables such as RG-58, which has a characteristic impedance of 50 ohms. The transmission line 6 is terminated with a load resistance 8. If the load resistance 8 does not match the characteristic impedance of the transmission line 6, it is well known that reflections will occur that may cause standing waves on the transmission line, as well as distortion of the signal on the transmission line and ringing. As previously discussed, this ringing results in EM radiation from the overall system. Proper matching of the load resistance 8 with the characteristic impedance of the transmission line 6 minimizes the ringing and EM radiation effects.

Figure 2:
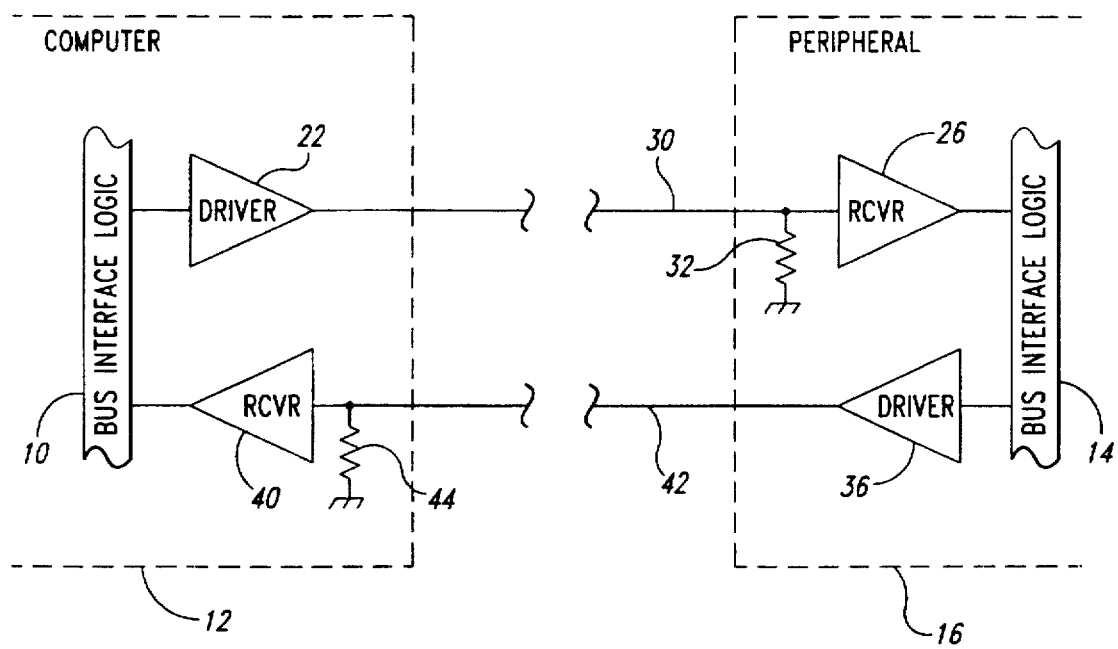
FIG. 2 is a functional block diagram illustrating a conventional bidirectional communication between a computer and peripheral device using two unidirectional transmission lines with fixed termination.

These same principles apply to computer systems connected to peripherals and transmitting data along a data bus or transmission line. For purposes of the present application, the data bus may be considered as a form of transmission line. The terms data bus and transmission line as used herein are interchangeable. FIG. 2 illustrates the conventional connection of a computer 12 with a peripheral 16, such as a printer, facsimile machine, second computer, or the like. The computer 12 includes bus interface logic 10 which is coupled to bus interface logic 14 within the peripheral 16. As those skilled in the art recognize, the bus interface logic 10 may comprise a plurality of integrated circuits connecting signals to and from a data bus (not shown) in the computer 12. Similarly, the bus interface logic 14 couples signals to and from a data bus (not shown) in the peripheral 16.

The bus interface logic 10 in the computer 12 and the bus interface logic 14 in the peripheral 16 each include bus termination resistors (not shown) to match the characteristic impedance of the data buses in the computer and peripheral. However, the example in FIG. 2 is directed to the interconnection between the computer 12 and the peripheral 16. A driver 22 within the computer 12 receives data from the bus interface logic 10 and transmits it to the peripheral 16 using a transmission line 30. Within the peripheral 16, a receiver 26 receives the data from the transmission line 30 and delivers it to the bus interface logic 14. A load resistance 32 within the peripheral 16 is used to terminate the transmission line 30 in its characteristic impedance. This minimizes the ringing and EM radiation from the transmission line 30.

The peripheral 16 also transmits data to the computer 12. A driver 36 within the peripheral 16 is coupled to the bus interface logic 14 and relays data from the peripheral to a receiver 40 in the computer using a transmission line 42. Data from the receiver 40 is coupled to the bus interface logic 10 in a conventional manner. The transmission line 42 is terminated by a load resistance 44 within the computer 12. As discussed above, the value of the load resistance 44 is selected to match the characteristic impedance of the transmission line 42. Thus, the transmission lines 30 and 42 are terminated by load resistances 32 and 44, respectively, to minimize ringing and EM radiation. It should be noted that these transmission lines 30 and 42 are unidirectional. That is, all data going from the computer 12 to the peripheral 16 is transmitted in one direction on the transmission line 30, while data being transmitted from the peripheral to the computer is transmitted in an opposite direction using the transmission line 42.

Figure 3:
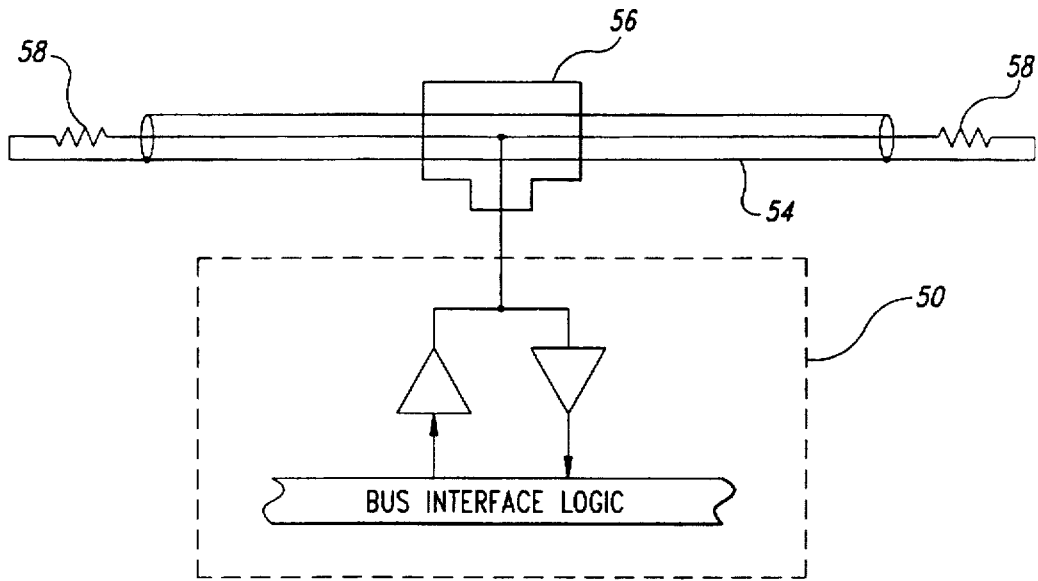
FIG. 3 is a functional block diagram illustrating a conventional bidirectional transmission line having a fixed termination resistance at each end.

FIG. 3 illustrates the use of a conventional bidirectional transmission line. A peripheral device 50, which may be a printer, facsimile machine, computer, or the like, is coupled to a transmission line 54 at a node 56. The peripheral device 50 has a high input impedance and does not provide a termination for the transmission line 54. However, the transmission line 54 is terminated at each end by load resistors 58. The load resistors 58 are designed to match the characteristic impedance of the transmission line 54. Thus, the system illustrated in the example of FIG. 3 provides the proper termination to minimize ringing and EM radiation.

Figure 4:
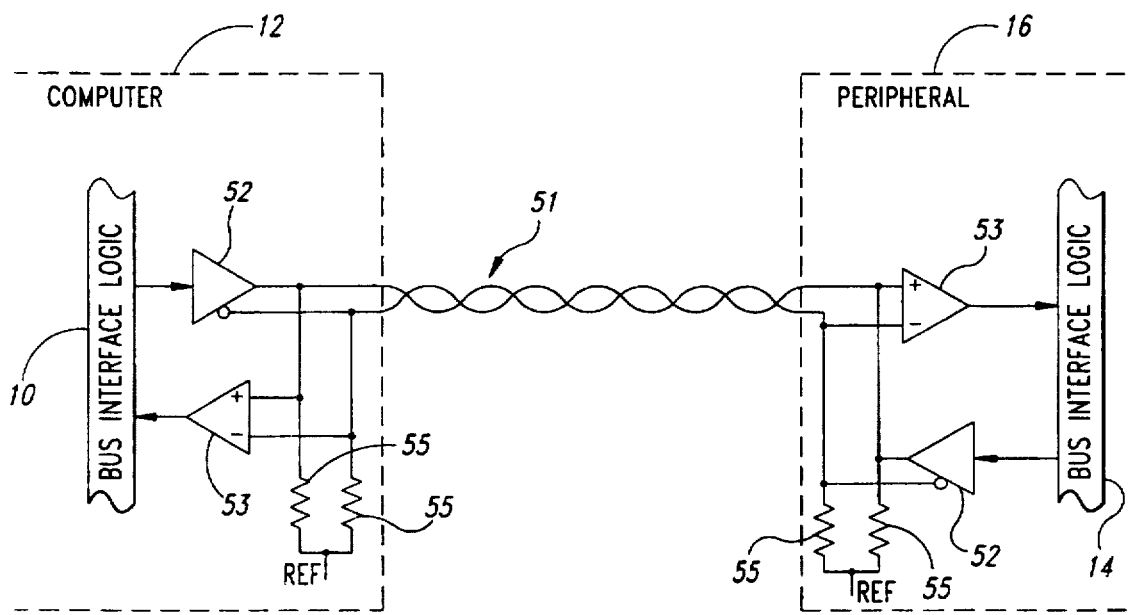
FIG. 4 is a functional block diagram illustrating the operation of a conventional bidirectional transmission line using an IEEE 1394 standard.
Figure 5:
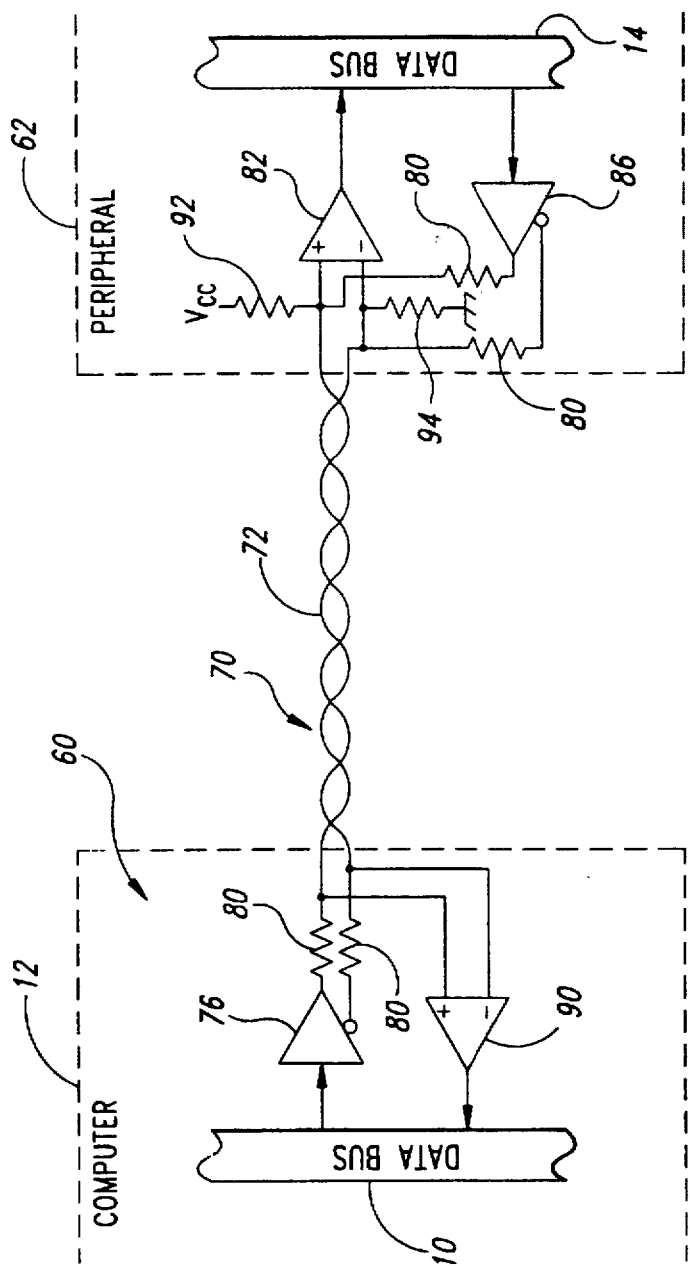
FIG. 5 is a functional block diagram illustrating the operation of a conventional bidirectional transmission line on a universal serial bus.

Another example of a transmission line, illustrated in FIG. 4, implements the IEEE 1394 standard for data transmission. The IEEE 1394 standard specifies a twisted pair transmission line 51. It should be noted that the IEEE 1394 standard calls for two sets of twisted pair transmission lines as well as power distribution wires. However, for the sake of brevity, only one twisted pair transmission line is illustrated in FIG. 4. A bus driver 52 in the computer 12 drives the twisted pair transmission line 51. A bus receiver 53 in the peripheral 16 receives the data from the twisted pair transmission line 51. A pair of termination resistors 55 in the peripheral 16 terminate the twisted pair transmission line 51 in its characteristic impedance. It should be noted that the twisted pair transmission line 51 is bidirectional. The line driver 52 in the computer 12 and the receiver 52 in the peripheral 16 permit the transmission of data from the computer to the peripheral over the twisted pair of transmission line. However, the peripheral 16 also includes a line driver 52 to transmit data from the peripheral to the computer 12 over the twisted pair of transmission line 51. A receiver 53 in the computer 12 receives data transmitted from the peripheral 16 over the twisted pair of transmission line 51. A pair of termination resistors 55 within the computer 12 terminate the computer end of the twisted pair of transmission line 51 in the characteristic impedance of the twisted pair of transmission line.

While the circuit illustrated in FIG. 4 permits high-speed data transmission, there are significant disadvantages to the fixed terminations 55 at both ends of the twisted pair transmission line 51. Specifically, the circuit illustrated in FIG. 4 is sub-optimal in its power usage. The line driver 52 is capable of delivering a given output power level. However, one half of the power generated by the line driver 52 is wasted by the fixed termination resistors 55 with the remaining power delivered to the twisted pair transmission line 51. For example, the line driver 52 in the computer 12 generates an output signal at a given power level. Only one half the power generated by the liner driver 52 in the computer 12 is actually delivered to the twisted pair transmission line 51. The remaining half of the power generated by the line driver 52 in the computer 12 is wasted in driving the fixed termination resistors 55 in the computer 12. A similar sub-optimal usage of power occurs in the peripheral 16 when the peripheral is transmitting data to the computer 12. That is, the line driver 52 in the peripheral 16 delivers only half the power to the twisted pair transmission line 51 with the other half of the power being wasted by the fixed termination resistors 55 in the peripheral 16. Thus, only half the power generated by the line driver 52 is actually useful in transmitting data.

As a consequence of the wasted power, another disadvantage of the circuit illustrated in FIG. 4 is that the fixed termination resistors 55 cause a significant decrease in the output voltage swing. For example, the line driver 52 in the computer 12 generates an output voltage. However, the parallel combination of the twisted pair transmission line 51 in the fixed termination resistors 55 in the computer 12 can cause reduction in the voltage output swing of the line driver. Thus, the fixed termination resistors 55 at each end of the twisted pair transmission line 51 provide appropriate termination of the twisted pair transmission line, but at a cost of wasted power and reduced output voltage swing. The result of the reduced voltage swing is a lower signal-to-noise ratio on the transmission line 51.

As the use of the computers has become more widespread, it has become desirable to simplify the interconnection of various peripheral devices with the computer. This is particularly true of personal computers where untrained users must unpackage and assemble their own computer system. To that end, a group of computer hardware and software manufacturers have developed a universal serial bus (USB). The USB is designed to simplify the interconnection of various components in a computer system. For example, the USB uses the same connector for all peripheral devices. The USB comprises a four-wire cable, with two of the four wires carrying power (+5 volts and ground) while the remaining two wires are a data bus. In a high speed version of the USB, the data bus is a twisted pair data cable, while the low speed version does not use twisted pair. The discussion herein is limited to the high speed version of the USB and the twisted pair data cable. Some additional details of the USB will be discussed below. However, the principles of the present invention apply to both versions of the USB, as well as other forms of data transmission lines. A complete description of the USB, including descriptions of the physical specification, are contained within a document entitled "Serial Bus Specification," Compaq Computer Corporation, Digital Equipment Corporation, Intel Corporation, Microsoft Corporation, NEC Corporation, and Northern Telecom, 1994, which is incorporated herein by reference in its entirety.

The advantage of the USB is that the user can connect various components in a variety of configurations. Since the USB specifies a common connector for all peripheral devices, interconnectivity is simplified. Furthermore, the USB cable is also identical for all peripheral devices. As illustrated in FIG. 4, the computer 12 contains a conventional USB interface 60, which is coupled to a conventional USB peripheral 62 by a four conductor wire cable 70. The wire cable 70 includes a twisted pair data cable 72 as well as two additional wires (not shown) carrying power from the computer 12 to the USB peripheral 62. The twisted pair data cable 72 provides bidirectional data communication between the computer 12 and the USB peripheral 62. The computer 12 transmits data to the USB peripheral 62 using a bus driver 76 coupled to the twisted pair data cable 72 through a pair of impedance matching resistors 80. The impedance matching resistors 80 match the low output impedance of the bus driver 76 to the characteristic impedance of the twisted pair data cable 72. It should be noted that the bus driver 76, which is a conventional component with a differential output to drive the two wires in the twisted pair data cable, is activated for data transmission by a control line (not shown). When the bus driver 76 is not activated, its outputs are in a high impedance state.

A bus receiver 82 within the USB peripheral 62 is coupled to the twisted pair data cable 72 and receives data transmitted from the computer 12. The USB peripheral 62 transmits data over the twisted pair data cable 72 using a bus driver 86. The USB peripheral 62 also includes a pair of impedance matching resistors 80 coupled to the bus driver 86 to match the characteristic impedance of the twisted pair data cable 72. The bus driver 86 is activated for data transmission by a control line (not shown). When the bus driver 86 is not activated, its outputs are in a high impedance state. A bus receiver 90 within the USB interface 60 of the computer 12 is coupled to the twisted pair data cable 72 and receives the data transmitted from the USB peripheral 62. Thus, the twisted pair data cable 72 permits bidirectional communications between the computer 12 and the USB peripheral 62.

The USB defines a transmit mode and a receive mode to control the bidirectional transfer of data over the twisted pair data cable 72. To transmit data from the computer 12 to the USB peripheral 62, the USB interface 60 is placed in the transmit mode while the USB peripheral is placed in the receive mode. Conversely, the USB peripheral 62 is placed in the transmit mode and the USB interface 60 is placed in the receive mode to permit the transfer of data from the USB peripheral to the computer 12 over the twisted pair data cable 72.

It should be noted that the USB peripheral 62 includes a resistor 92 coupled between one wire of the twisted pair data cable 72 and $V_{cc}$ (typically +5 VDC). In addition, the other wire of the twisted pair data cable 72 is coupled to ground through a resistor 94. The resistors 92 and 94 are used by the USB interface 60 in the computer 12 to maintain proper voltage levels for data signals and to detect the presence of the USB peripheral 62. All USB peripheral devices include such resistances. When the USB peripheral 62 is connected to the computer 12, the USB peripheral applies a voltage to the twisted pair data cable 72 that permits the USB interface 60 in the computer 12 to detect the presence of the USB peripheral. The resistors 92 and 94 each have a resistance of approximately 1.5 kilohms. In contrast, the characteristic impedance of the twisted pair data cable 72 is approximately 110 ohms. Because the values of the resistors 92 and 94 are significantly higher than the characteristic impedance of the twisted pair data cable 72, these resistors do not function as an impedance matching termination to the twisted pair data cable.

Furthermore, the impedance matching resistors 80 do not operate to terminate the twisted pair data cable 72 because the bus driver 76 or 86 at the end of the twisted pair data cable receiving data is in a high impedance state. When the USB peripheral 62 is in the receive mode and capable of receiving data over the twisted pair data cable 72, the bus driver 86 is inactive and its outputs are in a high impedance state. Therefore, the impedance matching resistors 80 in the USB peripheral 62 do not serve to properly terminate the twisted pair data cable 72. As a result of improper termination, signals transmitted from the USB interface 60 in the computer 12 to the USB peripheral 62 are reflected back onto the twisted pair data cable 72, resulting in ringing and undesirable EM radiation. Similarly, signals transmitted from the USB peripheral 62 to the USB interface 60 in the computer 12 are reflected back onto the twisted pair data cable 72 because the twisted pair data cable is not properly terminated within the USB interface in the computer.

The twisted pair data cable 72 can be properly terminated by a fixed termination at each end of the twisted pair data cable. However, such a circuit arrangement would degrade system performance since the bus driver 76 in the USB interface 60 would be driving both the twisted pair data cable 72 and the fixed termination (not shown) within the USB interface when the USB interface is in the transmit mode. As those skilled in the art will readily appreciate, such a circuit arrangement would divide the signal power transmitted from the bus driver 76, with half of the signal power being transmitted over the twisted pair data cable 72, and the other half of the signal power being wasted by driving the fixed termination (not shown) in the USB interface 60. Similarly, the bus driver 86 in the USB peripheral 62 would be forced to drive the twisted pair data cable 72 and the fixed termination (not shown) within the USB peripheral when the USB peripheral is in the transmit mode. As discussed above, this would cause the reduction in signal strength and a degradation of system performance because only one-half the power would be transmitted into the twisted pair data cable 72 while the other half of the power would be wasted by driving the fixed termination (not shown) in the USB peripheral 62. Since the USB peripheral 62 typically receives its power from the USB interface 60 in the computer 12 using the two power conductors ($V_{cc}$ and ground) of the wire cable 70, the USB peripheral has only a limited current available and the use of fixed terminations would consume a considerable amount of the total current available to the USB peripheral. Therefore, a fixed termination at each end of the twisted pair data cable 72 is an undesirable solution to the problem of terminating the twisted pair data cable in its characteristic impedance. The present invention uses switched bus terminations that are selectively activated only at the end of the twisted pair data cable 72 which is receiving data. This arrangement provides proper termination of the twisted pair data cable 72, thus minimizing ringing and EM radiation in a USB computer system.

Figure 6:
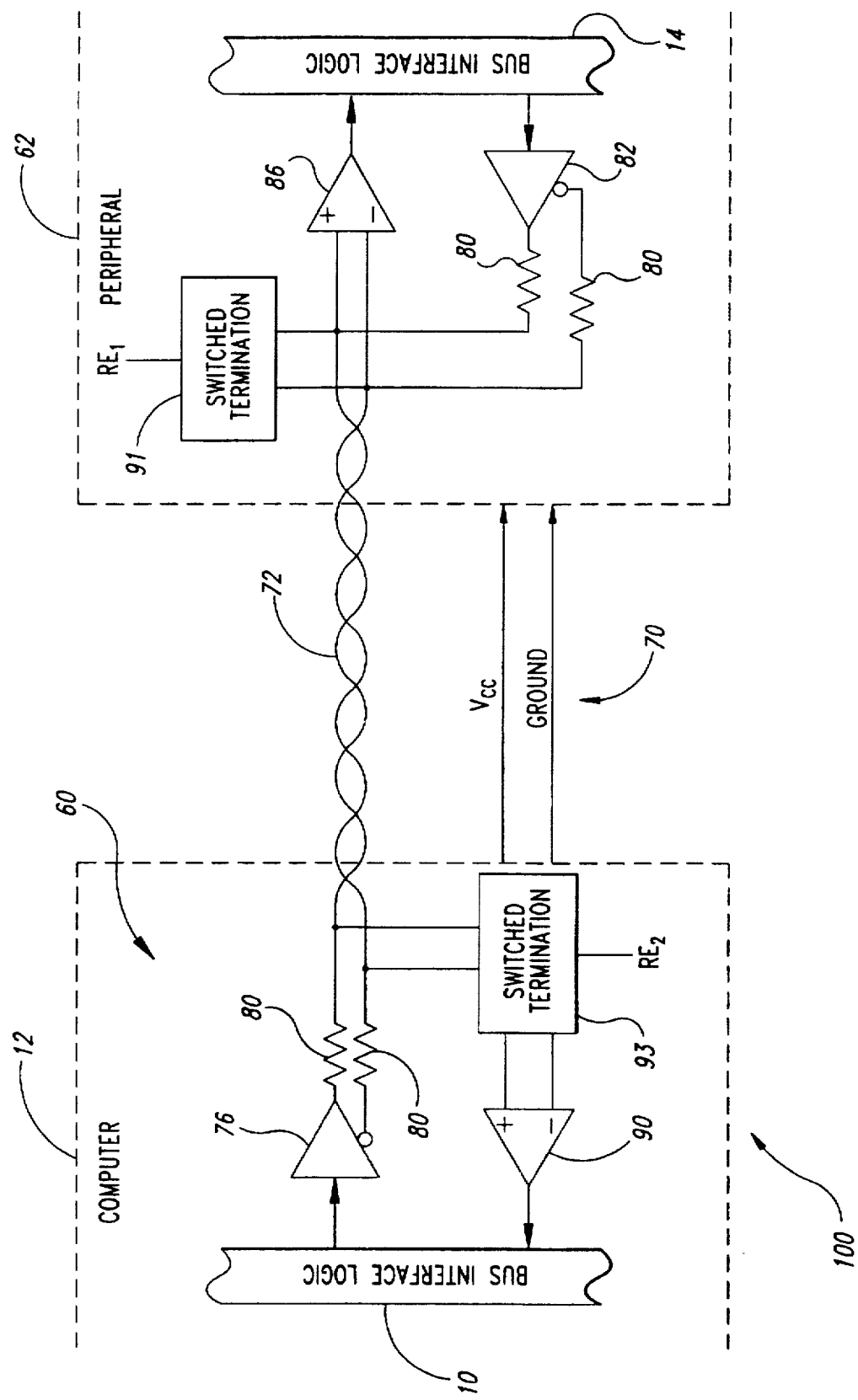
FIG. 6 is a functional block diagram of the universal serial bus incorporating the present invention.

A computer system 100 incorporating the present invention is illustrated in the functional block diagram of FIG. 6. Many of the components illustrated in FIG. 6 are the standard components of the USB, previously discussed with respect to FIG. 4. For example, the resistors 80 in the USB interface 60 and the USB peripheral 62 match the low impedance output of the line drivers 76 and 86, respectively, to the characteristic impedance of the twisted pair data cable 72. However, the system 100 includes a switched termination 91 at the end of the twisted pair data cable 72 in the USB peripheral 62, which is selectively activated when the USB peripheral is in the receive mode, and a switched termination 93 at the end of the twisted pair data cable in the USB interface 60 in the computer 12, which is selectively activated when the USB interface 60 is in the receive mode. The switched termination 91 terminates the twisted pair data cable 72 in its characteristic impedance of 110 ohms when the USB peripheral 62 is in the receive mode. The switched termination 91 is selectively enabled by a receive enable control signal "$RE_1$." The USB peripheral 62 generates the receive enable control signal $RE_1$ whenever the USB peripheral is in the receive mode. Similarly, the switched termination 93 terminates the twisted pair data cable 72 in its character impedance of 110 ohms when the USB interface 60 is in the receive mode. The switched termination 93 is selectively enabled by a receive enable control signal "$RE_2$." The USB interface 60 generates the receive enable control signal $RE_2$ whenever the USB interface is in the receive mode. Thus, the present invention selectively enables a termination at the end of the twisted pair data cable 72 which is receiving data.

Figure 7A:
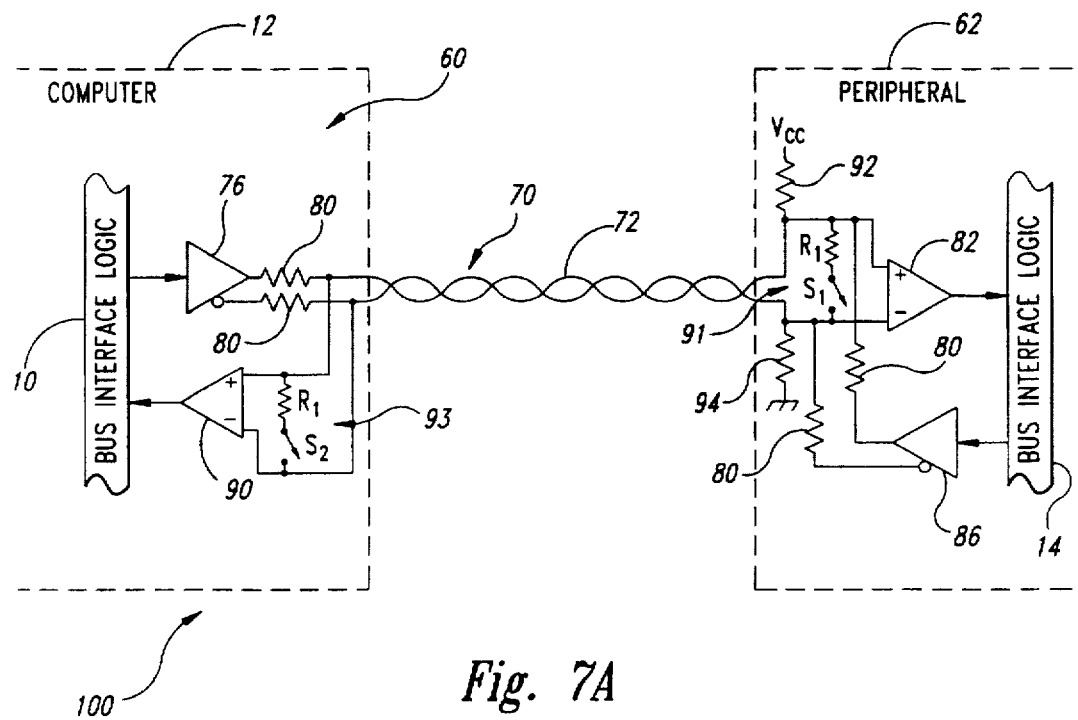
FIG. 7A is a functional block diagram illustrating the use of the present invention in the uniform serial data bus of FIG. 5.

One embodiment of the system 100 is illustrated in the functional block diagram of FIG. 7A. The switched termination 91 of the USB peripheral 62 includes a resistor $R_1$ coupled in series with a switch $S_1$ connected across the two wires of the twisted pair data cable 72 at the inputs of the bus receiver 82. Similarly, the switched termination 93 of the USB interface 60 in the computer 12 contains the resistor $R_1$ coupled in series with a switch $S_2$ connected across the two wires of the twisted pair data cable 72 at the inputs of the bus receiver 90. The switches $S_1$ and $S_2$ can be implemented by several different commercial products such as analog switches, transistors, and the like. As will be described below, the switches $S_1$ and $S_2$ are selectively activated or closed to provide a switched termination at the end of the twisted pair data cable 72 receiving data.

When the computer 12 is transmitting data to the USB peripheral 62 over the twisted pair data cable 72, the USB interface 60 is in the transmit mode while the USB peripheral is in the receive mode. The switch $S_1$ is selectively activated whenever the USB peripheral 62 is in the receive mode, thus providing the proper termination of the twisted pair data cable 72 at the peripheral end of the twisted pair data cable receiving data. When the USB peripheral 62 is transmitting data to the USB interface 60 in computer 12 over the twisted pair data cable 72, the USB peripheral 62 is in the transmit mode while the USB interface is in the receive mode. The switch $S_2$ is selectively activated whenever the USB interface 60 is in the receive mode, thus providing the proper termination of the twisted pair data cable 72 at the computer end of the twisted pair data cable receiving data.

Using the system 100, the twisted pair data cable 72 is selectively terminated only at the receiving end by either the resistor $R_1$ and the switch $S_1$, or the resistor $R_1$ and the switch $S_2$, depending on the direction of communication. The resistor $R_1$ has a selected value to match the characteristic impedance of the twisted pair data cable 72. In the embodiment illustrated in FIG. 7A, the resistance $R_1$ has a value selected to provide the appropriate termination of the twisted pair data cable 72. When the USB interface 60 is transmitting data to the USB peripheral 62, the switch $S_1$ is activated and the combination of the resistor $R_1$ and the switch $S_1$ provide an impedance that matches the characteristic impedance of the twisted pair data cable 72. If the USB peripheral 62 is transmitting data to the USB interface 60, the switch $S_2$ is activated and the combination of the resistor $R_1$ and the switch $S_2$ provide an impedance that matches the characteristic impedance of the twisted pair data cable 72. The system 100 provides the twin advantages of proper termination of the twisted pair data cable 72 and enhanced system performance by eliminating the need to drive fixed terminations at both ends of the twisted pair data cable.

Figure 7B:
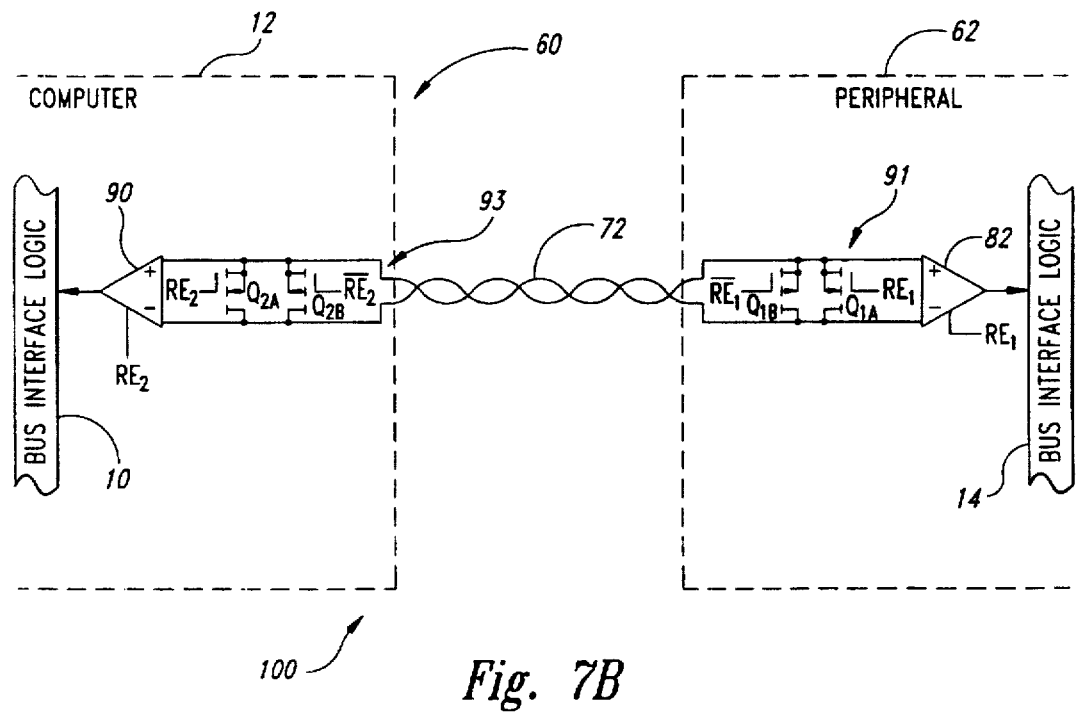
FIG. 7B is a circuit diagram illustrating one embodiment of the circuit of FIG. 7A.

FIG. 7B illustrates one embodiment of the circuit shown in the functional block diagram of FIG. 7A. In FIG. 7B, transistors $Q_{1A}$ and $Q_{1B}$ perform the functions of both the resistor $R_1$ and the switch $S_1$ in the USB peripheral 62. The transistors $Q_{1A}$ and $Q_{1B}$ are N-channel and P-channel field-effect transistors (FETs), respectively. The transistor $Q_{1A}$ is selectively activated (turned on) by the receive enable control signal $RE_1$ applied to the gate of the transistor, which also enables the bus receiver 82 within the USB peripheral 62 while the transistor $Q_{1B}$ is selectively activated by the complementary signal $\overline{RE_1}$. It should be noted that, for the sake of clarity, the bus drivers 76 and 86 have been omitted from FIG. 7B. In addition, the resistors 92 and 94 have also been omitted from FIG. 7B. The transistors $Q_{1A}$ and $Q_{1B}$ are selected to have a characteristic impedance that matches the characteristic impedance of the twisted pair data cable 72 when activated. Alternatively, the transistors $Q_{1A}$ and $Q_{1B}$ may have an impedance that is lower than the characteristic impedance of the twisted pair data cable 72 when activated. In this situation, the transistors $Q_{1A}$ and $Q_{1B}$ do not entirely perform the function of the resistor $R_1$ of FIG. 7A are used in series with the resistor $R_1$ as shown in FIG. 7A. The combination of the resistor $R_1$ and the transistors $Q_{1A}$ and $Q_{1B}$ provide an impedance that matches the characteristic impedance of the twisted pair data cable 72.

Transistors $Q_{2A}$ and $Q_{2B}$ are N-channel and P-channel FETs, respectively. The transistors $Q_{2A}$ and $Q_{2B}$ operate in a manner identical to that of transistors $Q_{1A}$ and $Q_{1B}$ with the exception that the transistor $Q_{2A}$ is selectively activated (turned on) by the receive enable control signal $RE_2$ applied on the gate of the transistor, which also enables the bus receiver 90 within the USB interface 60 in the computer 12. The transistor $Q_{2B}$ is selectively activated by the complementary signal $\overline{RE_2}$. The transistors $Q_{2A}$ and $Q_{2B}$ are selected to have a characteristic impedance that matches the characteristic impedance of the twisted pair data cable 72 when activated. As discussed above with respect to the transistors $Q_{1A}$ and $Q_{1B}$, the transistors $Q_{2A}$ and $Q_{2B}$ may be used alone or in combination with the resistor $R_1$ to provide the desired characteristic impedance.

The transistors $Q_{1A}$ and $Q_{1B}$ are activated when the USB peripheral 62 is in the receive mode, such that the USB peripheral is capable of receiving data transmitted from the USB interface 60 in the computer 12 over the twisted pair data cable 72. Conversely, the transistors $Q_{2A}$ and $Q_{2B}$ are activated when the USB interface 60 is in the receive mode. When the USB interface 60 is in the receive mode, it is capable of receiving data transmitted from the USB peripheral 62 over the twisted pair data cable 72. Thus, the transistor pairs $Q_{1A}$, $Q_{1B}$ and $Q_{2A}$, $Q_{2B}$ are selectively activated to provide a termination only at the receiving end of the twisted pair data cable 72. As discussed above, the termination of the twisted pair data cable in its characteristic impedance provides the proper impedance matching which reduces ringing and EM radiation. When the transistor pairs $Q_{1A}$, $Q_{1B}$ and $Q_{2A}$, $Q_{2B}$ are not activated, they are in a high impedance state and present no load to the twisted pair data cable 72. For example, when the USB peripheral 62 is in the transmit mode and the USB interface 60 is in the receive mode, the transistors $Q_{1A}$ and $Q_{1B}$ are not activated and the transistors $Q_{2A}$ and $Q_{2B}$ are activated. Thus, the twisted pair data cable 72 is terminated in its characteristic impedance only at the end that is receiving data while the switched termination 91 has no effect on the twisted pair data cable. This advantageously allows the USB peripheral 62 to transmit data onto the twisted pair data cable 72 at full power while the USB interface 60 has the proper termination for the twisted pair data cable to minimize ringing and EM radiation. FIG. 6B illustrates the transistor pairs $Q_{1A}$, $Q_{1B}$ and $Q_{2A}$, $Q_{2B}$ are illustrated as individual transistors. However, the transistor pairs are commercially available as a CMOS bilateral switch. The operation of CMOS bilateral switches are well known in the art, and need not be described in detail herein.

Figure 8A:
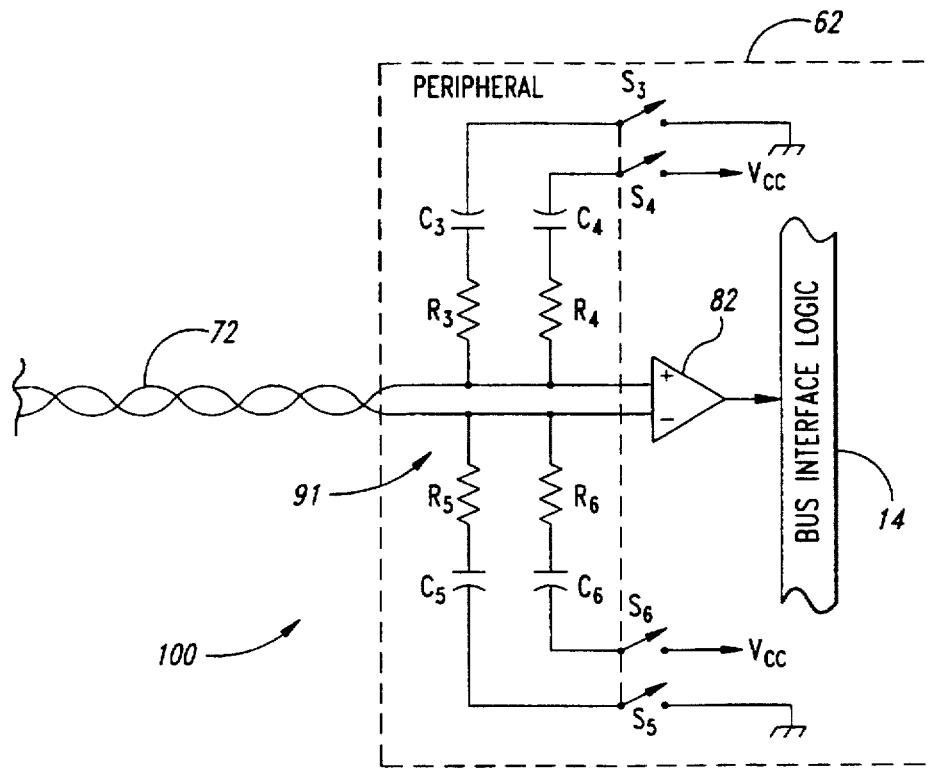
FIG. 8A is a functional block diagram illustrating an alternative embodiment of the present invention.

An alternative embodiment of the present invention is illustrated in FIG. 8A showing only the USB peripheral 62. For the sake of clarity, the circuit illustrated in FIG. 8A does not include the bus driver 86 in the USB peripheral 62. While not illustrated, USB interface 60 does include a circuit for the switched termination 93 that is identical to the switched termination 91 of the USB peripheral 62. The switched termination 91 in the USB peripheral 62 is selectively activated when the USB peripheral is in the receive mode. Similarly, the switched termination 93 (not shown in FIG. 8A) in the USB interface 60 is selectively activated when the USB interface in the computer 12 is in the receive mode. Thus, as described above, the embodiment illustrated in FIG. 8A also provides switched termination wherein the end of the twisted pair data cable 72 receiving data is selectively terminated in the characteristic impedance of the twisted pair data cable.

In FIG. 8A, each line of the twisted pair data cable 72 has an alternating current (AC) termination to both the positive voltage $V_{cc}$ and to ground. A resistor $R_3$ is connected in series with a capacitor $C_3$ and a switch $S_3$ between one wire of the twisted pair data cable 72 and the ground. A resistor $R_4$ is connected in series with a capacitor $C_4$ and a switch $S_4$ between the same wire of the twisted pair data cable 72 and the positive voltage $V_{cc}$. Similarly, a resistor $R_5$ is connected in series with a capacitor $C_5$ and a switch $S_5$ between the other wire of the twisted pair data cable 72 and the ground. A resistor $R_6$ is connected in series with a capacitor $C_6$ and a switch $S_6$ between the same other wire of the twisted pair data cable 72 and the positive voltage $V_{cc}$. The switches $S_3$–$S_6$ are all activated when the USB peripheral 62 is in the receive mode. The value for the resistors $R_3$–$R_6$ and $C_3$–$C_6$ are selected so that the aggregate impedance of these components equals the characteristic impedance of the twisted pair data cable 72. The value of the capacitors $C_3$–$C_6$ are selected using a nominal frequency of 6 megahertz, which corresponds to the maximum data transfer rate of 12 megabits per second specified by the USB. The advantage of the circuit illustrated in FIG. 8A is that it provides balanced termination of the twisted pair data cable 72. The capacitors $C_3$–$C_6$ are included to prevent excessive DC current drain when the switches $S_3$–$S_6$ are activated (i.e., closed). For example, when the switches $S_3$ and $S_4$ are closed, there is a conductive pathway from $V_{cc}$ through the switch $S_4$, the resistor $R_4$, the resistor $R_3$, and the switch $S_3$ to ground. If the capacitors $C_3$ and $C_4$ were not present, this low impedance pathway would cause excessive DC current drain in the USB peripheral 62. Similarly, there is a conductive pathway from $V_{cc}$ to ground when switches $S_5$ and $S_6$ are activated. The capacitors $C_5$ and $C_6$ provide an AC termination of the other wire in the twisted pair data cable 72 without causing excessive DC current drain.

Figure 8B:
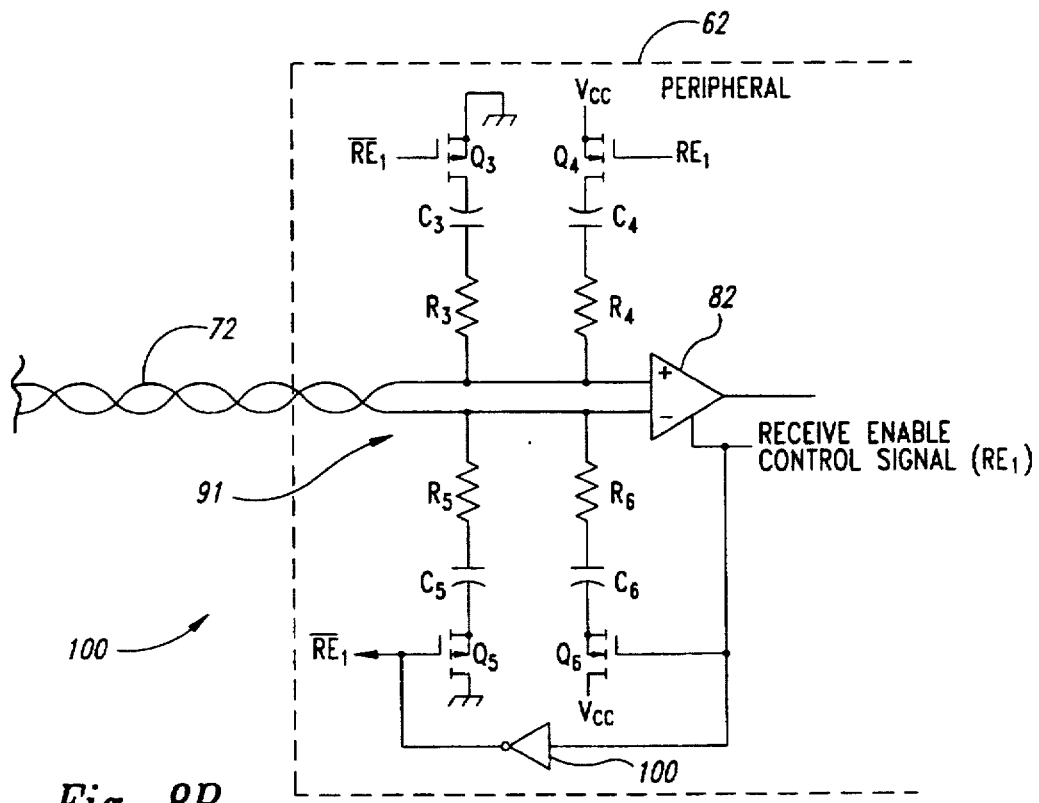
FIG. 8B is a circuit diagram of the embodiment of FIG. 7A.

The circuit of FIG. 8B illustrates more specifically the embodiment of the circuit of FIG. 8A. In FIG. 8B, transistors $Q_3$–$Q_6$ provide the function of the switches $S_3$–$S_6$, respectively. The transistors $Q_3$–$Q_6$ are selected so that the aggregate impedance of the switched termination 91 approximates the characteristic impedance of the twisted pair data cable 72. If the "ON" impedance of the transistors $Q_3$–$Q_6$ is sufficiently low, the contribution of the transistors $Q_3$–$Q_6$ to the aggregate impedance of the switched termination 91 is insignificant and may be ignored.

As previously discussed, the switched termination 91 is selectively activated when the USB peripheral 62 is in the receive mode. In the receive mode, the receive enable control signal $RE_1$ is enabled. The receive enable control signal $RE_1$ activates (ie., turns on) transistors $Q_4$ and $Q_6$, which are N-channel field-effect transistors (FETs). The transistors $Q_4$ and $Q_6$ are activated by a high level signal on their gate inputs. The high level signal is provided by the read enable control signal $RE_1$, which is generated within the USB peripheral 62. In contrast, the transistors $Q_3$ and $Q_5$ are P-channel FETs, which are activated by a low logic level signal, which is the inverted version of the receive enable control signal $RE_1$. An inverter 100 is coupled to the receive enable control signal $RE_1$ and generates an inverted receive enable control signal $\overline{RE_1}$. As with FIG. 8A, for the sake of clarity, FIG. 8B does not illustrate the switched termination 93 in the USB interface 60 in the computer 12. However, the switched termination 93 operates in a manner identical to that described above with respect to the switched termination 91 except that the switched termination 93 is activated only when the USB interface 60 in the computer 12 is in the receive mode.

While the specific embodiments described herein illustrate the transistors $Q_1$–$Q_6$ as FETs, those of ordinary skill in the art will readily recognize that any suitable switching transistors will suffice. For example, the transistors $Q_1$–$Q_6$ could be commercially available CMOS analog switches.

Figure 9:
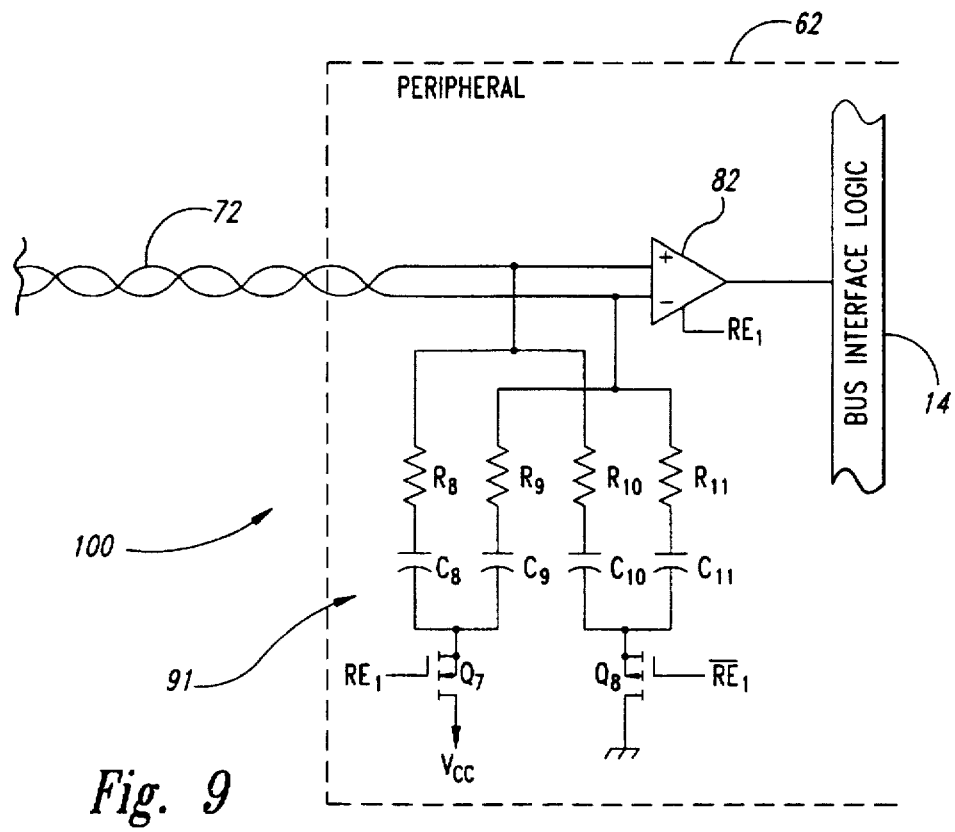
FIG. 9 is a circuit diagram of another alternative of the present invention.

FIG. 9 illustrates an alternative embodiment of the circuit of FIG. 8A. A single transistor $Q_7$ provides the functionality of both switches $S_4$ and $S_6$ of FIG. 8A, while a transistor $Q_8$ provides the functionality of both switches $S_3$ and $S_5$ of FIG. 8A. The operation of the circuit is substantially similar to that described for the circuit of FIG. 8B. The transistor $Q_7$ is selectively activated by the receive enable control signal $RE_1$, while the transistor $Q_8$ is selectively activated by the inverted receive enable control signal $\overline{RE_1}$. The value of the resistors are $R_8$–$R_{11}$, combined with capacitors $C_8$–$C_{11}$, together with the transistors $Q_7$ and $Q_8$ are selected to terminate the twisted pair data cable 72 in its characteristic impedance. As discussed above, the capacitors $C_8$–$C_{11}$ prevent DC current flow from $V_{cc}$ to ground when the switched termination 91 is activated. In yet another alternative embodiment of the FIG. 9, the resistors $R_8$ and $R_{10}$ can be combined into a single resistor (not shown). Similarly, the resistors $R_9$ and $R_{11}$ can be combined into a single resistor (not shown). Those skilled in the art will recognize that other circuit configurations are possible. All such configurations of switched termination are intended to be encompassed by the present invention.

Figure 10:
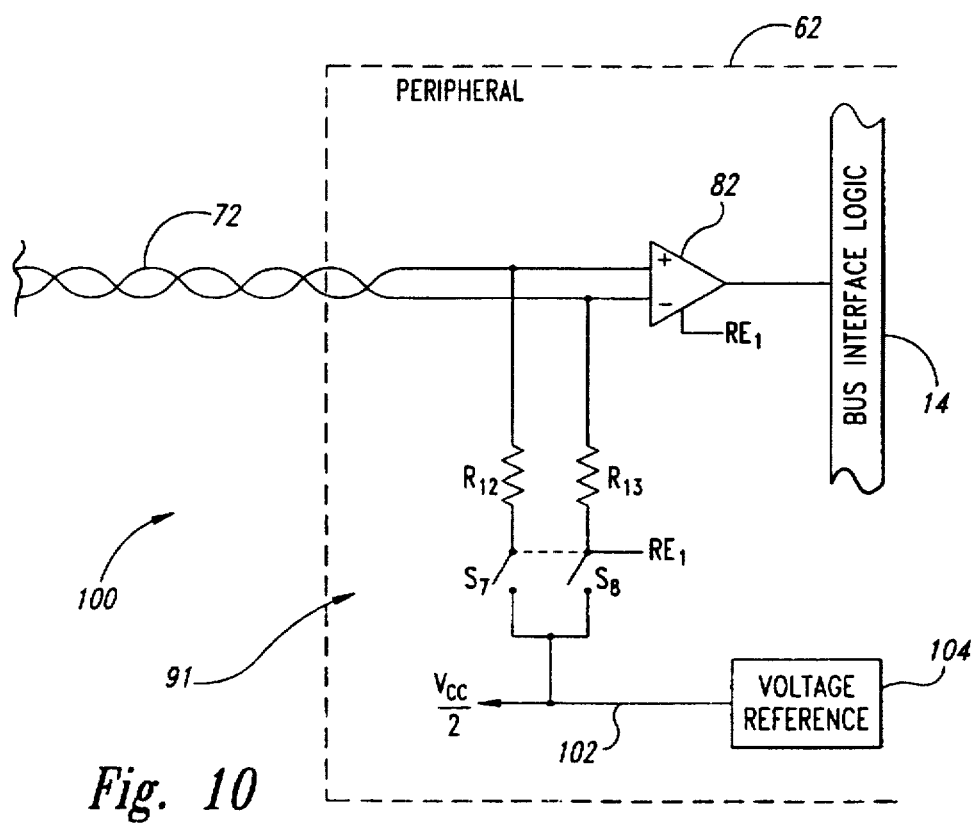
FIG. 10 is a circuit diagram of yet another alternative embodiment of the present invention.

In yet another alternative embodiment, the switched termination 91 can terminate the two wires of the twisted pair data cable 72 to a single reference point 102. In a preferred embodiment, the reference point 102 has a voltage Vcc/2, which is generated by a voltage reference 104, thus providing a common termination reference for each of the wires of the twisted pair data cable 72 while maintaining the electrical balance and symmetry of the switched termination 91. As with other examples of the switched termination, the combination of a resistor $R_{12}$ and switch $S_7$ combined with a resistor $R_{13}$ and switch $S_8$ terminate the twisted pair data cable 72 in its characteristic impedance when the switched termination 91 is activated. As previously discussed, the switched termination 91 is activated by the receive enable line $RE_1$. In a preferred embodiment, each of the switches $S_7$ and $S_8$ are CMOS bilateral switches. An example of a CMOS bilateral switch is provided in FIG. 7B where individual transistors $Q_{1A}$ and $Q_{1B}$ comprise a single CMOS bilateral switch. The operation of the CMOS bilateral switches is well known and need not be discussed in detail herein. For the sake of brevity, the switched termination 93 within the computer 12 is not illustrated in FIG. 10. However, it should be understood that the switched termination 93 in the computer 12 operates in a manner similar to that described above with respect to FIG. 10. However, the switched termination 93 in the computer 12 is activated by the read enable signal $RE_2$ while the switched termination 91 in the USB peripheral 62 is activated by the read enable signal $RE_1$.

The system 100 advantageously provides switched terminations that properly terminate a transmission line in its characteristic impedance when activated, but which have no effect on the transmission line when in an inactive state. Thus, the line drivers are able to deliver full power to the twisted pair data cable 72 rather than wasting one half of the power in the fixed terminations of the prior art. In addition, the voltage swing of the line drivers are not limited by having to drive both the transmission line and a fixed termination, as is the case in the IEEE 1394 standard illustrated in FIG. 4. A number of difference possible circuit configurations are provided in the examples illustrated in the figures. However, those of ordinary skill in the art will recognize that many different circuit configurations are possible for the switched terminations 91 and 93.

It is to be understood that even though various embodiments and advantages of the present invention have been set forth in the foregoing description, the above disclosure is illustrative only, and changes may be made in detail, yet remain within the broad principles of the invention. Therefore, the present invention is to be limited only by the appended claims.

What is claimed is:

1. A system for the termination of a universal serial data bus between first and second devices having transmitting and receiving modes, the system comprising:

a bidirectional data bus, including a two-wire twisted pair data cable with first and second wires having first and second ends, said data cable first end coupled to the first device and said data cable second end coupled to the second device;

a first bus driver having a driver input to receive data and a differential driver output coupled to said data cable first end, said first bus driver transmitting a first data signal from said data cable first end to said data cable second end when the universal serial data bus is in the transmitting mode;

a first bus receiver having a differential receiver input coupled to said data cable first end to receive data and a first receiver output, said first bus receiver receiving a second data signal from said data cable second end when the universal serial data bus is in the receiving mode;

a second bus driver having a driver input to receive data and a differential driver output coupled to said data cable second end, said second bus driver transmitting said second data signal from said data cable second end to said data cable first end when the universal serial data bus is in the receiving mode;

a second bus receiver having a differential receiver input coupled to said data cable second end to receive said first data signal and a second receiver output, said second bus receiver receiving said first data signal from said data cable first end when the universal serial data bus is in the transmitting mode;

a first termination coupled to said data cable first end and selectively activated when the universal serial data bus is in the receiving mode to terminate said data cable first end; and a second termination coupled to said data cable second end and selectively activated when the universal serial data bus is in the transmitting mode to terminate said data cable second end.

2. The system of claim 1 wherein said first and second terminations each include a resistive element.

3. The system of claim 2 wherein said resistive elements each includes a resistor coupled between said first and second wires of said two-wire twisted pair.

4. The system of claim 2 wherein said resistive elements each include a semiconductor switch element coupled between said first and second wires of said two-wire twisted pair data cable and having a first impedance when selectively activated and a second impedance higher than said first impedance when not selectively activated.

5. The system of claim 4 wherein said semiconductor switch elements each include an analog switch.

6. The system of claim 1 where in said first and second terminations each comprises a first termination element coupled between said first wire of said two-wire twisted pair data cable and a first reference signal and a second termination element coupled between said second wire of said two-wire twisted pair data cable and a second reference signal.

7. The system of claim 1 wherein said first and second terminations each includes a switch coupled between said first wire of said two-wire twisted pair data cable and a termination reference, said switches being activated by switch control commands to selectively activate either said first termination or said second termination.

8. The system of claim 7 wherein said termination reference is said second wire of said two-wire twisted pair data cable.

9. The system of claim 7 wherein said switches each include a transistor.

10. The system of claim 9 wherein said transistor is a field-effect transistor.

11. The system of claim 1 wherein said first and second terminations each include a capacitive element operating to provide an alternating current (AC) pathway for said first and second terminations, respectively.

12. The system of claim 11 wherein said capacitive elements each include a first capacitor coupled between said first wire of said two-wire twisted pair data cable and a first termination reference and a second capacitor coupled between said second wire of said two-wire twisted pair data cable and a second termination reference.

13. The system of claim 12 wherein said first and second terminations each includes a switch coupled between said first wire of said two-wire twisted pair data cable and a termination reference, said switches being activated by switch control commands to selectively activate either said first termination or said second termination and to thereby couple said capacitive elements to said first and second reference terminations.

14. The system of claim 11 wherein said first and second terminations each include a resistive element connected in series with said capacitive element to provide said AC pathway for said first and second terminations, respectively.

15. A system for the termination of a bidirectional serial data bus coupled between a first device and a second device, including a two-wire twisted pair data cable with first and second wires having first and second ends with twisted pair bus drivers at the first and second data cable ends, the twisted pair bus driver at the data cable first end transmitting a first data signal from the data cable first end to the data cable second end when the data bus is in a transmitting mode and the twisted pair bus driver at the data cable second end transmitting a second data signal from the data cable second end to the data cable first end when the data bus is in a receiving mode, the system comprising:

a first twisted pair bus receiver having first and second receiver inputs coupled to the first and second wires, respectively, at the data cable first end to receive the second data signal from the data cable second end when the data bus is in the receiving mode;

a second twisted pair bus receiver having first and second receiver inputs coupled to the first and second wires, respectively, at the data cable second end to receive the first data signal from the data cable first end when the data bus is in the transmitting mode;

a first twisted pair termination coupled to the first and second wires, respectively, at the data cable first end and selectively activated when the data bus is in the receiving mode to terminate the data cable first end; and a second twisted pair termination coupled to the first and second wires, respectively, at the data cable second end and selectively activated when the data bus is in the transmitting mode to terminate the data cable second end, whereby said first termination is inactive and said second termination is active when the data bus is in the transmitting mode and said first termination is active and said second termination is inactive when the data bus is in the receiving mode.

16. The system of claim 15 wherein said first and second twisted pair terminations each include a resistive element.

17. The system of claim 16 wherein said resistive elements each include a semiconductor switch element having a first impedance when selectively activated and a second impedance higher than said first impedance when not selectively activated.

18. A system for the termination of a bidirectional serial data bus coupled between a first device and a second device, including a data cable having first and second ends with bus drivers at the first and second data cable ends wherein the data cable includes a two-wire twisted pair having first and second wires, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination, including a resistive element, coupled to the data cable first end and selectively activated when the data bus is in the receiving mode to terminate the data cable first end; and a second termination, including a resistive element, coupled to the data cable second end and selectively activated when the data bus is in the transmitting mode to terminate the data cable second end, said resistive elements each including a resistor coupled between said first and second wires of said two-wire twisted pair.

19. A system for the termination of a bidirectional serial data bus coupled between a first device and a second device, including a data cable having first and second ends with bus drivers at the first and second data cable ends wherein the data cable includes a two-wire twisted pair having first and second wires, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination, including a resistive element, coupled to the data cable first end and selectively activated when the data bus is in the receiving mode to terminate the data cable first end; and a second termination, including a resistive element, coupled to the data cable second end and selectively activated when the data bus is in the transmitting mode to terminate the data cable second end wherein said resistive elements each include a semiconductor switch element having a first impedance when selectively activated and a second impedance higher than said first impedance when not selectively activated and said semiconductor switch elements are coupled between said first and second wires of said two-wire twisted pair data cable.

20. A system for the termination of a bidirectional serial data bus coupled between a first device and a second device, including a two-wire data cable having first and second ends with bus drivers at the first and second data cable ends, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination coupled to the data cable first end and selectively activated when the data bus is in the receiving mode to terminate the data cable first end, said first termination coupling first and second wires of the two-wire data cable to a common reference level at the data cable first end; and a second termination coupled to the data cable second end and selectively activated when the data bus is in the transmitting mode to terminate the data cable second end, said second termination coupling the first and second wires of the two-wire data cable to a common reference level at the data cable second end.

21. A system for the termination of a bidirectional serial data bus coupled between a first device and a second device, including a data cable having first and second ends with bus drivers at the first and second data cable ends wherein the data cable includes a two-wire twisted pair having first and second wires, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination coupled to the data cable first end and selectively activated when the data bus is in the receiving mode to terminate the data cable first end; and a second termination coupled to the data cable second end and selectively activated when the data bus is in the transmitting mode to terminate the data cable second end wherein said first and second terminations each comprises a first termination element coupled between said first wire of said two-wire twisted pair data cable and a first reference signal and a second termination element coupled between said second wire of said two-wire twisted pair data cable and a second reference signal.

22. A system for the termination of a bidirectional serial data bus coupled between a first device and a second device, including a data cable having first and second ends with bus drivers at the first and second data cable ends wherein the data cable includes a two-wire twisted pair having first and second wires, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination coupled to the data cable first end and selectively activated when the data bus is in the receiving mode to terminate the data cable first end; and a second termination coupled to the data cable second end and selectively activated when the data bus is in the transmitting mode to terminate the data cable second end wherein said first and second terminations each includes a switch coupled between said first wire of said two-wire twisted pair data cable and a termination reference, said switches being activated by switch control commands to selectively activate either said first termination or said second termination.

23. The system of claim 22 wherein said termination reference is said second wire of said two-wire twisted pair data cable.

24. A system for the termination of a bidirectional serial data bus coupled between a first device and a second device, including a data cable having first and second ends with bus drivers at the first and second data cable ends, the bus driver at the data cable first end transmitting a first data signal from the data cable first end to the data cable second end when the data bus is in a transmitting mode and the bus driver at the data cable second end transmitting a second data signal from the data cable second end to the data cable first end when the data bus is in a receiving mode, the system comprising:

a first bus receiver having a receiver input coupled to the data cable first end to receive the second data signal from the data cable second end when the data bus is in the receiving mode;

a second bus receiver having a receiver input coupled to the data cable second end to receive the first data signal from the data cable first end when the data bus is in the transmitting mode;

a first termination coupled to the data cable first end and selectively activated when the data bus is in the receiving mode to terminate the data cable first end; and a second termination coupled to the data cable second end and selectively activated when the data bus is in the transmitting mode to terminate the data cable second end wherein said first and second terminations each include a capacitive element operating to provide an alternating current (AC) pathway for said first and second terminations, respectively whereby said first termination is inactive and said second termination is active when the data bus is in the transmitting mode and said first termination is active and said second termination is inactive when the data bus is in the receiving mode.

25. The system of claim 24 wherein said data cable includes a two-wire twisted pair having first and second wires and said capacitive elements each include a first capacitor coupled between said first wire of said two-wire twisted pair data cable and a first termination reference and a second capacitor coupled between said second wire of said two-wire twisted pair data cable and a second termination reference.

26. The system of claim 25 wherein said first and second terminations each includes a switch coupled between said first wire of said two-wire twisted pair data cable and a termination reference, said switches being activated by switch control commands to selectively activate either said first termination or said second termination and to thereby couple said capacitive elements to said first and second reference terminations.

27. The system of claim 24 wherein said first and second terminations each include a resistive element connected in series with said capacitive element to provide said AC pathway for said first and second terminations, respectively.

28. A system for the termination of a computer bidirectional serial data bus, including a two-wire twisted pair data cable, having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:
   a first twisted pair termination coupled to the data bus first end and selectively activated when the data bus is in the receiving mode to terminate the data bus first end;
   a second twisted pair termination coupled to the data bus second end and selectively activated when the data bus is in the transmitting mode to terminate the data bus second end; and
   a bus controller to generate at least a first bus enable signal to control said first and second twisted pair terminations wherein said first twisted pair termination is inactive and said second twisted pair termination is active when the data bus is in the transmitting mode and said first twisted pair termination is active and said second twisted pair termination is inactive when the data bus is in the receiving mode.

29. The system of claim 28 wherein said first and second twisted pair terminations each include a resistive element.

30. The system of claim 29 wherein said relative elements each include a semiconductor switch element having a first impedance when selectively activated and a second impedance higher than said first impedance when not selectively activated.

31. The system of claim 28 wherein the two-wire twisted pair data cable has first and second wires and said first and second terminations each includes a switch coupled between the first wire of the two-wire twisted pair data cable and a termination reference, said switches being activated by said bus enable signal to selectively activate either said first termination or said second termination.

32. A system for the termination of a computer bidirectional serial two-conductor data bus having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:
   a first termination coupled to the data bus first end and selectively activated when the data bus is in the receiving mode to couple first and second conductors of the two-conductor data bus to a common reference level at the data bus first end and thereby terminate the data bus first end; and
   a second termination coupled to the data bus second end and selectively activated when the data bus is in the transmitting mode to couple the first and second conductors of the two-conductor data bus to a common reference level at the data bus second end and thereby terminate the data bus second end whereby said first termination is inactive and said second termination is active when the data bus is in the transmitting mode and said first termination is active and said second termination is inactive when the data bus is in the receiving mode.

33. A system for the termination of a computer bidirectional serial data bus having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:
   a first termination coupled to the data bus first end and selectively activated when the data bus is in the receiving mode to terminate the data bus first end; and
   a second termination coupled to the data bus second end and selectively activated when the data bus is in the transmitting mode to terminate the data bus second end wherein the data bus has first and second wires and said first and second terminations each comprises a first termination element coupled between the first wire of the data bus and a first reference signal and a second termination element coupled between the second wire of the data bus and a second reference signal.

34. A system for the termination of a computer bidirectional serial data bus having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:
   a first termination coupled to the data bus first end and selectively activated when the data bus is in the receiving mode to terminate the data bus first end; and
   a second termination coupled to the data bus second end and selectively activated when the data bus is in the transmitting mode to terminate the data bus second end wherein the data bus has first and second wires and said first and second terminations each includes a switch coupled between the first wire of the data bus and a termination reference, said switches being activated by switch control commands to selectively activate either said first termination or said second termination wherein said termination reference is said second wire of the bus interface logic.

35. A system for the termination of a computer bidirectional serial data bus having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:
   a first termination coupled to the data bus first end and selectively activated when the data bus is in the receiving mode to terminate the data bus first end; and
   a second termination coupled to the data bus second end and selectively activated when the data bus is in the transmitting mode to terminate the data bus second end wherein the data bus has first and second wires and said first and second terminations each includes a switch coupled between the first wire of the data bus and a termination reference, said switches being activated by switch control commands to selectively activate either said first termination or said second termination wherein the system is powered by first and second voltage reference levels and said termination reference is a voltage level substantially halfway between said first and second voltage reference levels.

36. A system for the termination of a computer bidirectional serial data bus having first and second ends and coupled to a first device at the first end and to a second device at the second end, the data bus having a transmitting mode to transmit data from the data bus first end to the data bus second end and a receiving mode to receive data transmitted from the data bus second end to the data bus first end, the system comprising:

a first termination coupled to the data bus first end and selectively activated when the data bus is in the receiving mode to terminate the data bus first end; and a second termination coupled to the data bus second end and selectively activated when the data bus is in the transmitting mode to terminate the data bus second end wherein said first and second terminations each include a capacitive element operating to provide an alternating current (AC) pathway for said first and second terminations, respectively.

37. A method for the termination of a twisted pair bidirectional serial data bus coupled to a first device at a first end and to a second device at a second end, the data bus having a transmitting mode to transmit data from the data bus first end to the data bus second end and a receiving mode to receive data transmitted from the data bus second end to the data bus first end, the method comprising the steps of:

selectively activating a first twisted pair termination coupled to the data bus first end when the data bus is in the receiving mode to terminate the data bus first end; and selectively activating a second twisted pair termination coupled to the data bus second end when the data bus is in the transmitting mode to terminate the data bus second end wherein said first twisted pair termination is inactive and said second twisted pair termination is active when the data bus is in the transmitting mode and said first twisted pair termination is active and said second twisted pair termination is inactive when the data bus is in the receiving mode.

38. The method of claim 37 wherein said first and second twisted pair terminations each include a resistive element to terminate the data bus.

39. The method of claim 38 wherein said resistive elements each include a semiconductor switch element mode having a first impedance when selectively activated and a second impedance higher than said first impedance when not selectively activated, and said step of selectively activating said first and second twisted pair terminations includes activating said semiconductor switch element in said first twisted pair termination when the data bus is in the transmitting mode and activating said semiconductor switch element in said second twisted pair termination when the data bus is in the receiving mode.

40. The method of claim 37 wherein the twisted pair data bus includes first and second wires and said first and second twisted pair terminations each includes a switch coupled between the first wire of the twisted pair data bus and a termination reference, said step of selectively activating said first and second twisted pair terminations including activating said switches with switch control commands to selectively activate either said first twisted pair termination or said second twisted pair termination.

41. A method for the termination of a computer bidirectional serial data bus coupled to a first device at a first end and to a second device at a second end, the data bus having a transmitting mode to transmit data from the data bus first end to the data bus second end and a receiving mode to receive data transmitted from the data bus second end to the data bus first end, the method comprising the steps of:

selectively activating a first termination coupled to the data bus first end when the data bus is in the receiving mode to terminate the data bus first end; and selectively activating a second termination coupled to the data bus second end when the data bus is in the transmitting mode to terminate the data bus second end wherein the data bus includes first and second wires and said step of selectively activating said first termination includes coupling a first element between the first wire of the data bus first end and a first reference signal and a second termination element coupled between the second wire of the data bus first end and a second reference signal, said step of selectively activating said second termination includes coupling a first element between the first wire of data bus second end and said first reference signal and a second termination element coupled between the second wire of the data bus second end and said second reference signal.

42. A method for the termination of a computer bidirectional serial data bus coupled to a first device at a first end and to a second device at a second end, the data bus having a transmitting mode to transmit data from the data bus first end to the data bus second end and a receiving mode to receive data transmitted from the data bus second end to the data bus first end, the method comprising the steps of:

selectively activating a first termination coupled to the data bus first end when the data bus is in the receiving mode to terminate the data bus first end; and selectively activating a second termination coupled to the data bus second end when the data bus is in the transmitting mode to terminate the data bus second end wherein the data bus first and second wires and said first and second terminations each includes a switch coupled between the first wire of the data bus and a termination reference, said step of selectively activating said first and second terminations including activating said switches with switch control commands to selectively activate either said first termination or said second termination wherein said termination reference is the second wire of the data bus.

43. A method for the termination of a computer bidirectional serial data bus coupled to a first device at a first end and to a second device at a second end, the data bus having a transmitting mode to transmit data from the data bus first end to the data bus second end and a receiving mode to receive data transmitted from the data bus second end to the data bus first end, the method comprising the steps of:

selectively activating a first termination coupled to the data bus first end when the data bus is in the receiving mode to terminate the data bus first end; and selectively activating a second termination coupled to the data bus second end when the data bus is in the transmitting mode to terminate the data bus second end wherein the data bus first and second wires and said first and second terminations each includes a switch coupled between the first wire of the data bus and a termination reference, said step of selectively activating said first and second terminations including activating said switches with switch control commands to selectively activate either said first termination or said second termination wherein the first and second devices are powered by first and second voltage reference levels and said termination reference is a voltage level substantially halfway between said first and second voltage reference levels.

44. A method for the termination of a computer bidirectional serial data bus coupled to a first device at a first end and to a second device at a second end, the data bus having a transmitting mode to transmit data from the data bus first end to the data bus second end and a receiving mode to receive data transmitted from the data bus second end to the data bus first end, the method comprising the steps of:

selectively activating a first termination coupled to the data bus first end when the data bus is in the receiving mode to terminate the data bus first end; and selectively activating a second termination coupled to the data bus second end when the data bus is in the transmitting mode to terminate the data bus second end wherein said first and second terminations each include a capacitive element and said step of selectively activating said first and second terminations includes coupling the capacitive elements to the data bus to provide an alternating current (AC) pathway for said first and second terminations, respectively.

* * * * *